United States Patent
Namie

(10) Patent No.: US 10,469,032 B2
(45) Date of Patent: Nov. 5, 2019

(54) POWER AMPLIFIER CIRCUIT

(71) Applicant: Murata Manufacturing Co., Ltd., Kyoto (JP)

(72) Inventor: Hisanori Namie, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/979,899

(22) Filed: May 15, 2018

(65) Prior Publication Data

US 2018/0375474 A1  Dec. 27, 2018

(30) Foreign Application Priority Data

May 16, 2017 (JP) .................. 2017-097615

(51) Int. Cl.
| | |
|---|---|
| H03F 3/191 | (2006.01) |
| H03F 1/02 | (2006.01) |
| H03G 1/00 | (2006.01) |
| H03F 3/24 | (2006.01) |
| H03F 3/195 | (2006.01) |

(52) U.S. Cl.
CPC .......... *H03F 1/0211* (2013.01); *H03F 3/195* (2013.01); *H03F 3/245* (2013.01); *H03G 1/0029* (2013.01); *H03F 2200/18* (2013.01); *H03F 2201/3215* (2013.01); *H03F 2203/21145* (2013.01); *H03G 1/0082* (2013.01)

(58) Field of Classification Search
CPC ........ H03F 1/0211; H03F 3/195; H03F 3/245; H03F 2201/3215; H03F 2200/18; H03F 2203/21145; H03F 1/0261; H03F 1/302; H03F 1/301; H03F 3/191; H03F 1/56; H03F 1/565; H03G 1/0029; H03G 1/0082; H03G 3/3042; H03G 3/3047
USPC ................. 330/285, 296, 302, 310
See application file for complete search history.

(56) References Cited

U.S. PATENT DOCUMENTS

| | | | |
|---|---|---|---|
| 7,969,240 B2 | 6/2011 | Searle et al. | |
| 9,287,832 B2* | 3/2016 | Hagisawa | H03F 1/30 |
| 9,473,076 B2* | 10/2016 | Ni | H03F 1/32 |
| 9,525,389 B2* | 12/2016 | Hirooka | H03F 1/0261 |
| 2001/0020872 A1 | 9/2001 | Miyazawa | |
| 2001/0033199 A1 | 10/2001 | Aoki | |

(Continued)

FOREIGN PATENT DOCUMENTS

| | | |
|---|---|---|
| JP | 2001-223547 A | 8/2001 |
| JP | 2005-6212 A | 1/2005 |
| JP | 2014-171170 A | 9/2014 |

*Primary Examiner* — Khanh V Nguyen
(74) *Attorney, Agent, or Firm* — Pearne & Gordon LLP

(57) ABSTRACT

A power amplifier circuit includes a transistor, a bias current source, and an adjustment circuit. The transistor amplifies an RF signal when supplied with a variable power supply voltage. The bias current source supplies a bias current to the base of the transistor through a first current path. The adjustment circuit increases a current flowing from the bias current source to an input terminal of a matching circuit through a second current path as the variable power supply voltage decreases, and decreases the bias current flowing from the bias current source to the base of the transistor through the first current path as the current flowing from the bias current source to the input terminal through the second current path increases.

14 Claims, 14 Drawing Sheets

(56) References Cited

U.S. PATENT DOCUMENTS

2014/0253243 A1    9/2014   Hagisawa et al.
2015/0171797 A1    6/2015   Ni et al.

* cited by examiner

POWER AMPLIFIER CIRCUIT

This application claims priority from Japanese Patent Application No. 2017-097615 filed on May 16, 2017. The content of this application is incorporated herein by reference in its entirety.

BACKGROUND

The present disclosure relates to a power amplifier circuit. Mobile communication terminals such as cellular phones include power amplifier circuits for amplifying radio frequency (RF) signals to be transmitted to a base station. A power amplifier circuit includes a transistor that amplifies an RF signal, and a bias circuit that controls the bias point of the transistor. One known bias circuit of this type is described in, for example, Japanese Unexamined Patent Application Publication No. 2014-171170, which includes an emitter follower transistor that provides a bias signal to the transistor, and a constant voltage generation circuit for generating a constant voltage to be supplied to the collector of the emitter follower transistor.

The bias circuit described in Japanese Unexamined Patent Application Publication No. 2014-171170 may have gain-dispersion characteristics that do not match characteristics required by a customer. Gain dispersion refers to the difference in gains experienced when the power supply voltage to be supplied to a transistor changes, and it is desirable to improve gain-dispersion characteristics to exert the performance of an envelope-tracking power supply circuit.

BRIEF SUMMARY

Accordingly, the present disclosure proposes a power amplifier circuit with improved gain-dispersion characteristics.

According to embodiments of the present disclosure, a power amplifier circuit includes (i) a matching circuit having an input terminal and an output terminal, (ii) a transistor having a base connected to the output terminal, and a collector supplied with a variable power supply voltage greater than or equal to a first voltage and less than or equal to a second voltage, the transistor being configured to amplify an RF signal input from the input terminal to the base of the transistor via the matching circuit and the output terminal, (iii) a bias current source that supplies a bias current to the base of the transistor through a first current path, and (iv) an adjustment circuit that adjusts the bias current supplied to the base of the transistor in accordance with the variable power supply voltage. A voltage higher than the first voltage and lower than the second voltage is defined as a third voltage. When the variable power supply voltage is greater than or equal to the first voltage and less than or equal to the third voltage, the adjustment circuit increases a current flowing from the bias current source to the input terminal through a second current path as the variable power supply voltage decreases, and decreases the bias current flowing from the bias current source to the base of the transistor through the first current path as the current flowing from the bias current source to the input terminal through the second current path increases.

According to embodiments of the present disclosure, a power amplifier circuit can achieve improved gain-dispersion characteristics.

Other features, elements, characteristics and advantages of the present disclosure will become more apparent from the following detailed description of embodiments of the present disclosure with reference to the attached drawings.

DETAILED DESCRIPTION

Embodiments of the present disclosure will be described hereinafter with reference to the drawings. Note that circuit elements denoted by the same numerals represent the same or substantially the same circuit elements and are not repeatedly described.

Figure 1:
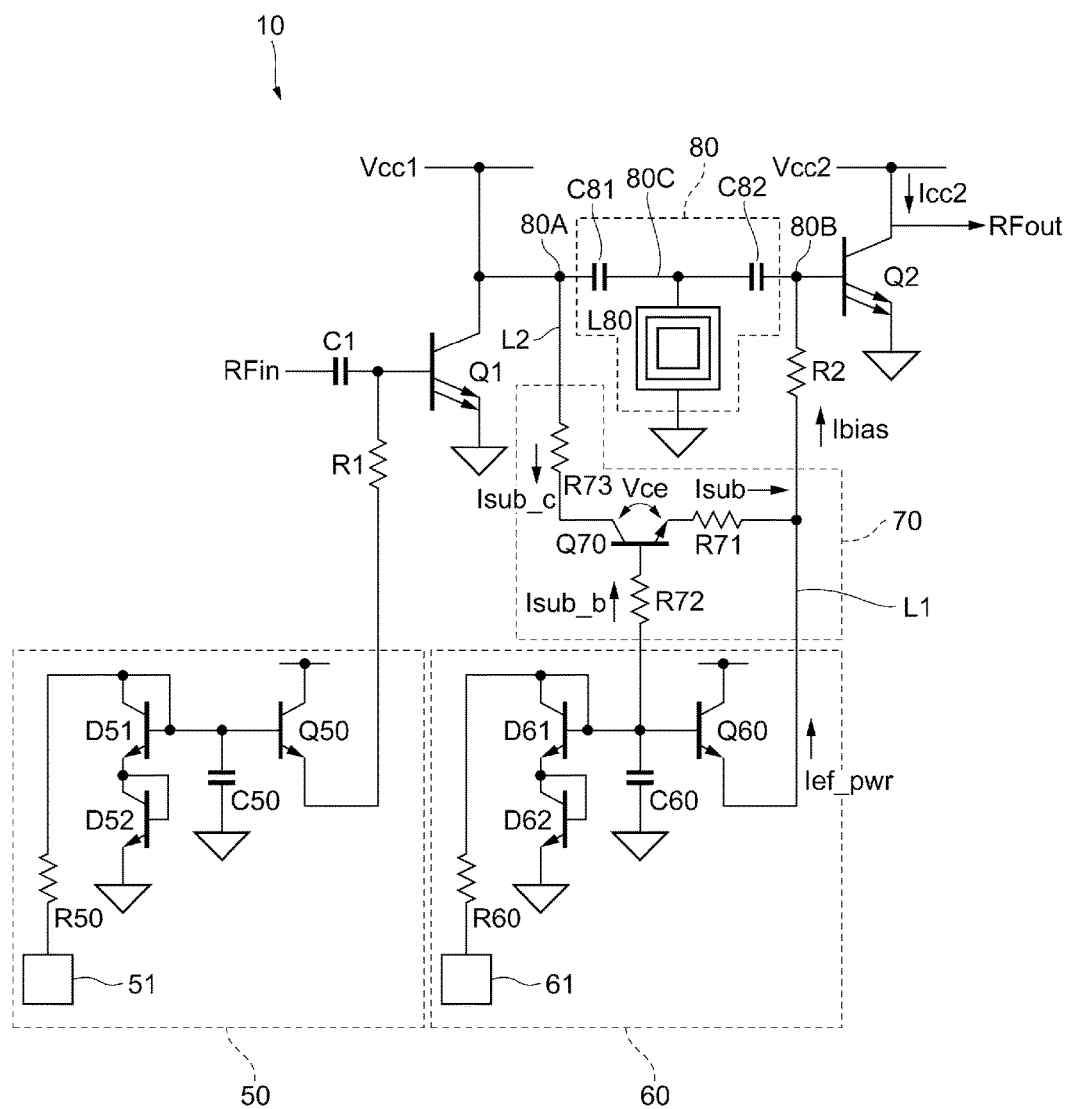
FIG. 1 is a circuit diagram of a power amplifier circuit according to a first embodiment of the present disclosure.

FIG. 1 is a circuit diagram of a power amplifier circuit 10 according to a first embodiment of the present disclosure. The power amplifier circuit 10 is included in a mobile communication terminal such as a cellular phone and is configured to amplify the power of an input signal RFin to a level necessary to transmit the input signal RFin to a base station and output the resulting signal as an amplified signal RFout. The input signal RFin is an RF signal modulated in accordance with a predetermined communication scheme by using, for example, a radio frequency integrated circuit (RFIC) or the like.

The power amplifier circuit 10 includes transistors Q1 and Q2, bias current sources 50 and 60, an adjustment circuit 70, and a matching circuit 80. The transistor Q1 is cascade-connected in a stage preceding the transistor Q2. The transistor Q1 functions as a driver-stage amplifier, and the transistor Q2 functions as an output-stage amplifier. The transistor Q1 is a common-emitter transistor having a base to which the input signal RFin is provided via a capacitor element C1 and a collector from which an amplified signal is output. A variable power supply voltage Vcc1 is supplied to the collector of the transistor Q1. The transistor Q2 is a common-emitter transistor having a base to which the amplified signal is input from the transistor Q1 and a collector from which the amplified signal RFout, which is obtained by further amplifying the amplified signal, is output. A variable power supply voltage Vcc2 is supplied to the collector of transistor Q2. The variable power supply voltages Vcc1 and Vcc2 are supplied from an envelope-tracking power supply circuit (not illustrated), for example. The transistors Q1 and Q2 are, for example, heterojunction bipolar transistors.

The matching circuit 80 is connected between the transistors Q1 and Q2 to match impedances of both transistors. The matching circuit 80 includes an input terminal 80A, an output terminal 80B, a signal line 80C, capacitor elements C81 and C82, and an inductor element L80. The input terminal 80A is connected to the collector of the transistor Q1, and the output terminal 80B is connected to the base of the transistor Q2. The signal line 80C connects the input terminal 80A and the output terminal 80B. The capacitor elements C81 and C82 are connected between the input terminal 80A and the output terminal 80B along the signal line 80C. The inductor element L80 is shunt-connected between the signal line 80C and ground. The amplified signal (RF signal) from the transistor Q1 is input from the input terminal 80A to the base of the transistor Q2 through the matching circuit 80 and the output terminal 80B.

The bias current source 50 supplies a bias current to the base of the transistor Q1 via a resistor element R1 to control the bias point of the transistor Q1. The bias current source 50 includes an emitter follower transistor Q50 and diodes D51 and D52. The emitter follower transistor Q50 has a base connected to the anode of the diode D51 and also connected to ground via a capacitor element C50. The emitter follower transistor Q50 has an emitter connected to the base of the transistor Q1 via the resistor element R1. The anode of the diode D51 is connected to a power supply terminal 51 via a resistor element R50. The power supply terminal 51 supplies a constant voltage or current. The anode of the diode D52 is connected to the cathode of the diode D51. The cathode of the diode D52 is connected to ground. The diodes D51 and D52 are, for example, diode-connected bipolar transistors. The term "diode-connection" refers to a form of connecting the base and collector of a bipolar transistor. A diode-connected bipolar transistor behaves as a two-pole element equivalent to a diode. One of the two terminals of a diode-connected bipolar transistor having a higher potential when forward biased is referred to as an "anode" and the other terminal, having a lower potential, is referred to as a "cathode". However, the diodes D51 and D52 are not limited to diode-connected bipolar transistors and may be P-N junction diodes, for example.

The bias current source 60 supplies a bias current to the base of the transistor Q2 via a resistor element R2 to control the bias point of the transistor Q2. The bias current source 60 includes an emitter follower transistor Q60 and diodes D61 and D62. The emitter follower transistor Q60 has a base connected to the anode of the diode D61 and also connected to ground via a capacitor element C60. The emitter follower transistor Q60 has an emitter connected to the base of the transistor Q2 via the resistor element R2. The anode of the diode D61 is connected to a power supply terminal 61 via a resistor element R60. The power supply terminal 61 supplies a constant voltage or current. The anode of the diode D62 is connected to the cathode of the diode D61. The cathode of the diode D62 is connected to ground. The diodes D61 and D62 may be diode-connected bipolar transistors, for example, or may be P-N junction diodes.

The adjustment circuit 70 adjusts the bias current supplied to the base of the transistor Q2 in accordance with the variable power supply voltage Vcc2. The adjustment circuit 70 includes a transistor Q70 and resistor elements R71, R72, and R73. The transistor Q70 has an emitter connected to the base of the transistor Q2 via the resistor elements R71 and R2 and also connected to the emitter of the emitter follower transistor Q60. The transistor Q70 has a base connected to the base of the emitter follower transistor Q60 via the resistor element R72. The transistor Q70 has a collector connected to the input terminal 80A of the matching circuit 80 via the resistor element R73. The transistor Q70 is a heterojunction bipolar transistor whose emitter and base form a heterojunction, with the emitter having a wider bandgap than the bandgap of the base.

Currents flowing through the resistor elements R71, R72, and R73 are denoted by Isub, Isub_b, and Isub_c, respectively. A current output from the emitter of the emitter follower transistor Q60 is denoted by Ief_pwr, and a bias current supplied to the base of the transistor Q2 is denoted by Ibias. Further, a current flowing in the collector of transistor Q2 is denoted by Icc2. A voltage between the base and collector of the transistor Q70 is denoted by Vce. Since the bias current Ibias is given by Ibias=Ief_pwr+Isub, each of the current Ief_pwr and the current Isub partially contributes to the adjustment of the bias point of the transistor Q2. Thus, each of the current Ief_pwr and the current Isub may be referred to herein as a "bias current". Note that the current Isub is given by Isub=Isub_b+Isub_c.

Figure 2:
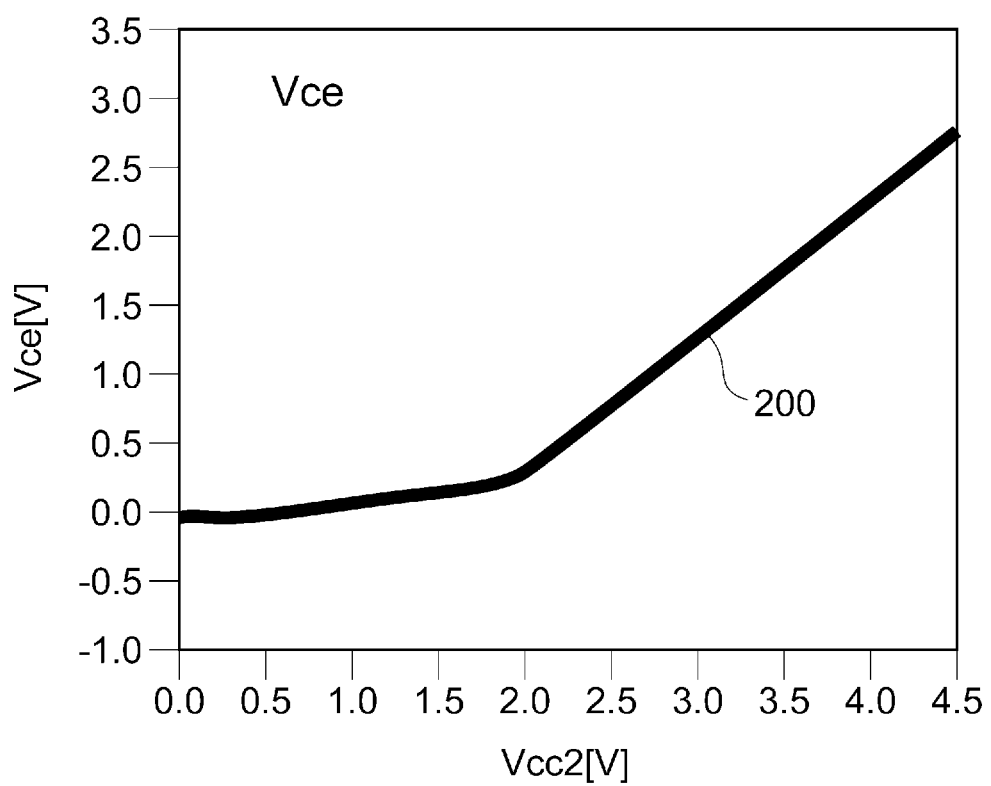
FIG. 2 is a graph depicting a relationship between a variable power supply voltage supplied to a transistor for amplifying an RF signal and a voltage between the base and collector of a heterojunction bipolar transistor that adjusts a bias current supplied to the transistor, in accordance with the first embodiment of the present disclosure.
Figure 3:
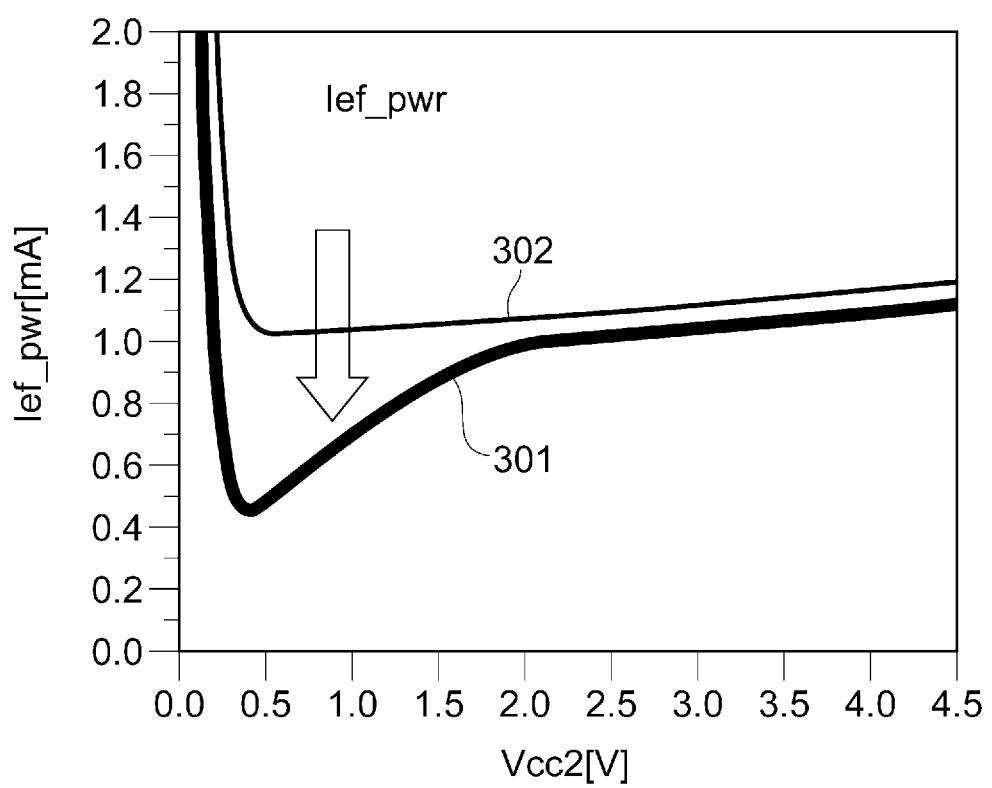
FIG. 3 is a graph depicting a relationship between the variable power supply voltage supplied to the transistor for amplifying an RF signal and the bias current supplied to the transistor, in accordance with the first embodiment of the present disclosure.
Figure 4:
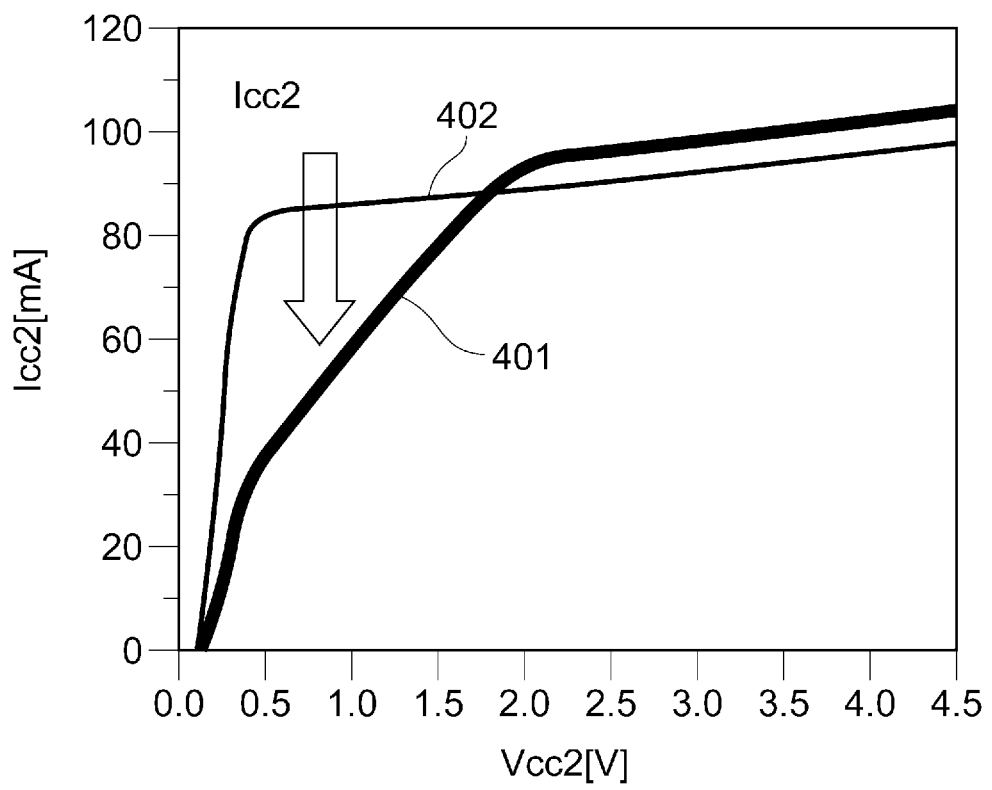
FIG. 4 is a graph depicting a relationship between the variable power supply voltage supplied to the transistor for amplifying an RF signal and a current flowing in the collector of the transistor, in accordance with the first embodiment of the present disclosure.
Figure 5:
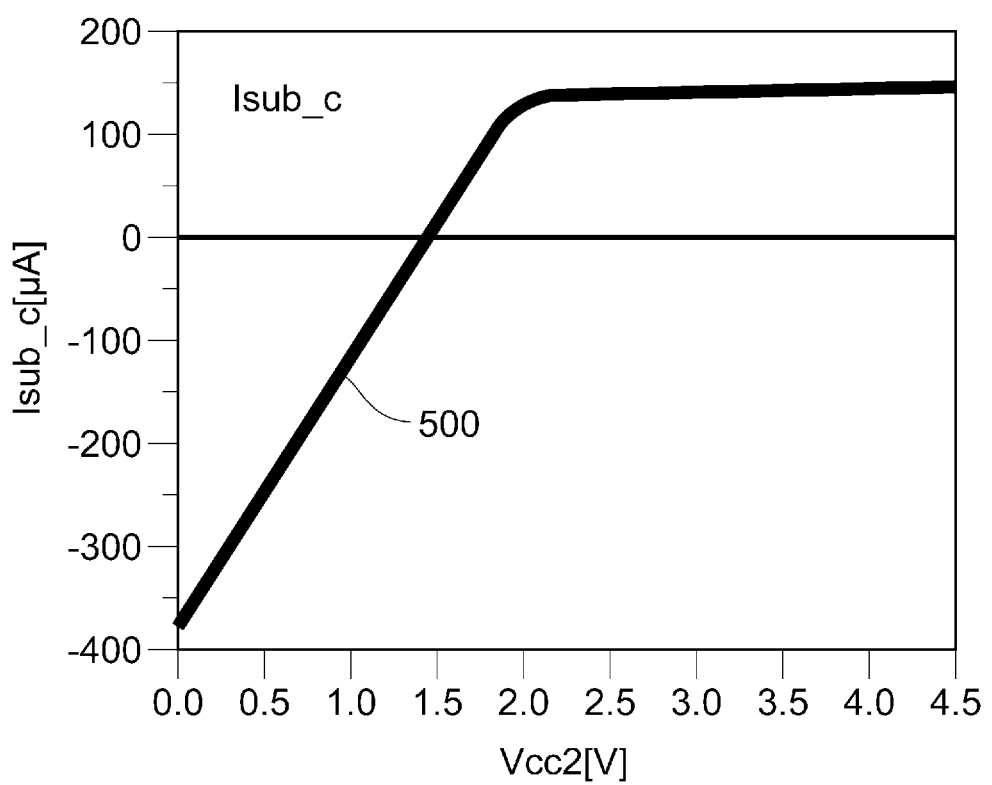
FIG. 5 is a graph depicting a relationship between the variable power supply voltage supplied to the transistor for amplifying an RF signal and a current flowing through an adjustment circuit that adjusts the bias current supplied to the transistor, in accordance with the first embodiment of the present disclosure.
Figure 6:
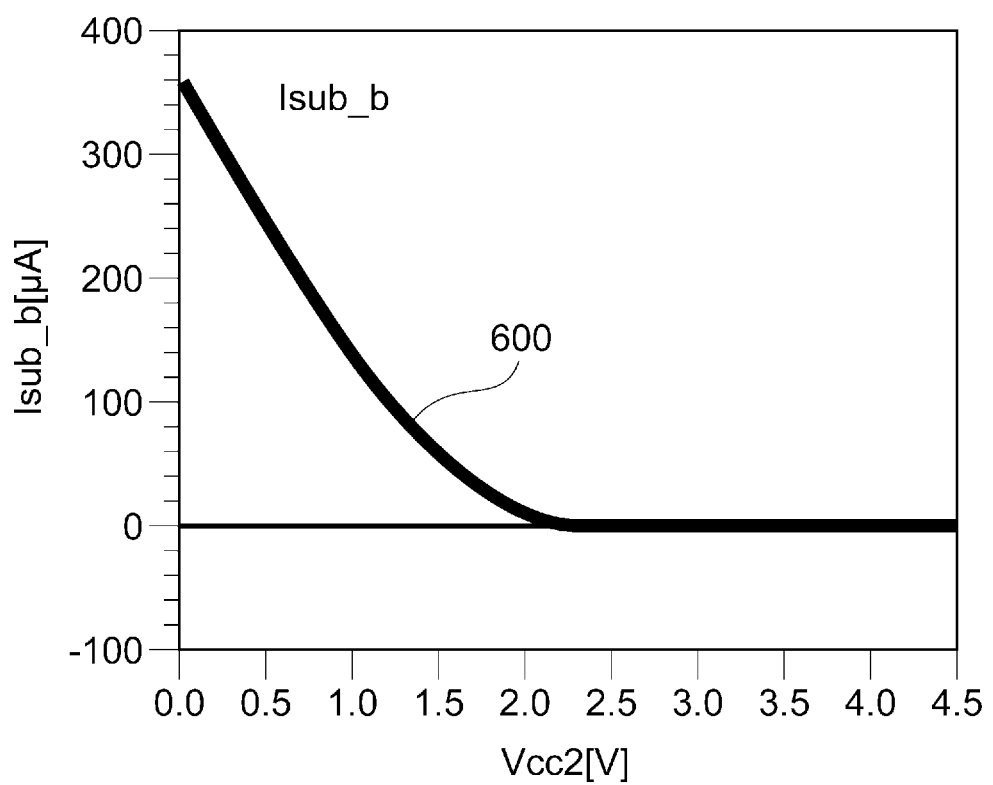
FIG. 6 is a graph depicting a relationship between the variable power supply voltage supplied to the transistor for amplifying an RF signal and a current flowing through the adjustment circuit that adjusts the bias current supplied to the transistor, in accordance with the first embodiment of the present disclosure.
Figure 7:
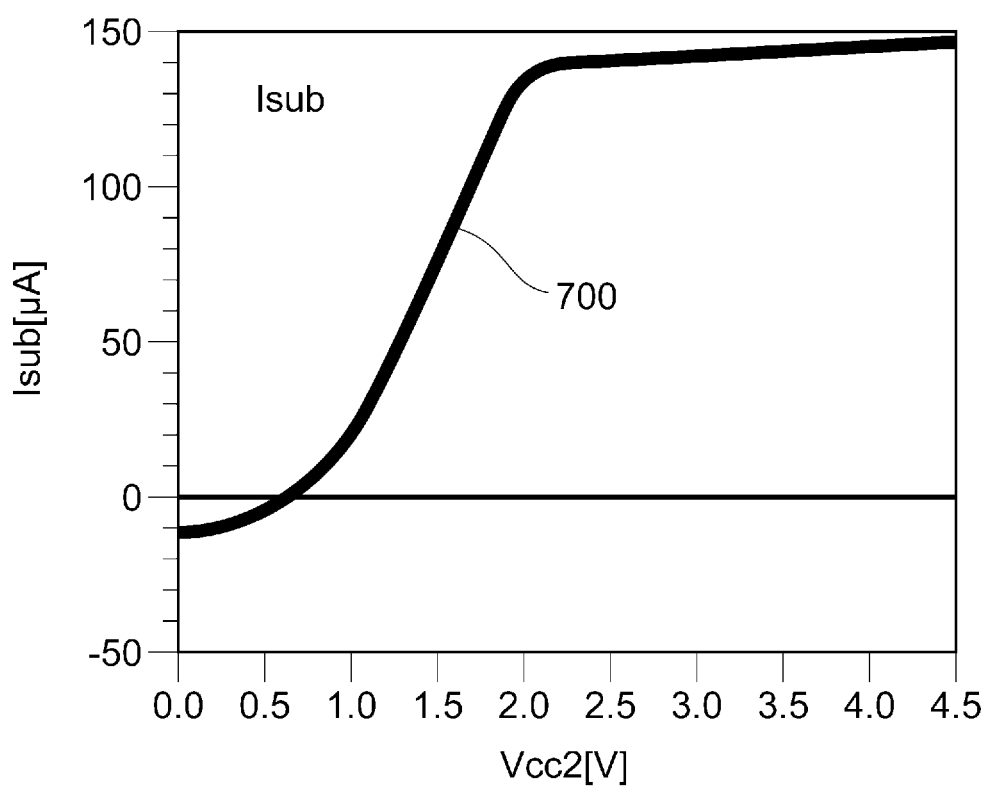
FIG. 7 is a graph depicting a relationship between the variable power supply voltage supplied to the transistor for amplifying an RF signal and a current flowing through the adjustment circuit that adjusts the bias current supplied to the transistor, in accordance with the first embodiment of the present disclosure.

Next, the operation of the power amplifier circuit 10 will be described with reference to FIGS. 2 to 7. In FIG. 2, a graph 200 depicts a relationship between the voltage Vce across the transistor Q70 and the variable power supply voltage Vcc2. In FIG. 2, the horizontal axis represents the variable power supply voltage Vcc2 and the vertical axis represents the voltage Vce. In FIG. 3, a graph 301 depicts a relationship between the current Ief_pwr and the variable power supply voltage Vcc2. In FIG. 3, the horizontal axis represents the variable power supply voltage Vcc2 and the vertical axis represents the current Ief_pwr. In FIG. 4, a graph 401 depicts a relationship between the current Icc2 and the variable power supply voltage Vcc2. In FIG. 4, the horizontal axis represents the variable power supply voltage Vcc2 and the vertical axis represents the current Icc2. In FIG. 5, a graph 500 depicts a relationship between the current Isub_c and the variable power supply voltage Vcc2. In FIG. 5, the horizontal axis represents the variable power supply voltage Vcc2 and the vertical axis represents the current Isub_c. In FIG. 6, a graph 600 depicts a relationship between the current Isub_b and the variable power supply voltage Vcc2. In FIG. 6, the horizontal axis represents the variable power supply voltage Vcc2 and the vertical axis represents the current Isub_b. In FIG. 7, a graph 700 depicts a relationship between the current Isub and the variable power supply voltage Vcc2. In FIG. 7, the horizontal axis represents the variable power supply voltage Vcc2 and the vertical axis represents the current Isub. The graphs illustrated in FIGS. 2 to 7 depict the results of simulation using the variable power supply voltage Vcc2 having a range greater than or equal to 0 V and less than or equal to 4.5 V. The range of the variable power supply voltage Vcc2 actually supplied to the collector of transistor Q2 is not necessarily limited to the range used in this simulation. The lower limit of the variable power supply voltage Vcc2 is referred to herein as a "first voltage", and the upper limit of the variable power supply voltage Vcc2 is referred to herein as a "second voltage". The first voltage is, for example, 1.0 V, and the second voltage is, for example, 4.5 V.

Since the transistor Q70 is a heterojunction bipolar transistor, the turn-on voltage across the base-collector P-N junction (approximately 1.1 V) is different from the turn-on voltage across the base-emitter P-N junction (approximately 1.3 V). Thus, the transistor Q70 exhibits different behaviors depending on the value of the variable power supply voltage Vcc2 relative to a certain voltage higher than the first voltage and lower than the second voltage (e.g., approximately 1.5 V). This voltage referred to herein as a "third voltage". When the variable power supply voltage Vcc2 is in a range higher than the third voltage and lower than the second voltage, the transistor Q70 operates as an emitter-follower circuit. When the variable power supply voltage Vcc2 is in a range greater than or equal to the first voltage and less than or equal to the third voltage, in contrast, the transistor Q70 operates as two P-N junction diodes. For convenience of illustration, a path through which current flows from the bias current source 60 to the base of the transistor Q2 via the resistor element R2 is referred to as a "first current path". The emitter of the transistor Q70 is connected to a first current path L1 via the resistor element R71. A path through which current flows from the bias current source 60 to the input terminal 80A via the resistor element R72, the base and collector of the transistor Q70, and the resistor element R73 is referred to as a "second current path". The base of the emitter follower transistor Q60 is connected to a second current path L2 via the resistor element R72. The emitter of the emitter follower transistor Q60 is connected to the base of the transistor Q2 via the first current path L1. A path through which current flows from the input terminal 80A to the base of the transistor Q2 via the resistor element R73, the collector and emitter of the transistor Q70, the resistor element R71, and the resistor element R2 is referred to as a "third current path".

When the transistor Q70 operates as an emitter-follower circuit, the current Ief_pwr flows from the bias current source 60 to the base of the transistor Q2 through the first current path L1 and also the current Isub flows from the input terminal 80A to the base of the transistor Q2 through third current path. At this time, the current Isub_b is negligibly small (see FIG. 6), and thus the current Isub is substantially equal to the current Isub_c.

When the transistor Q70 operates as two P-N junction diodes, in contrast, current flows from the bias current source 60 to the input terminal 80A through the second current path L2. This is because the turn-on voltage across the base-collector P-N junction of the transistor Q70 is lower than the turn-on voltage across the base-emitter P-N junction of the transistor Q70 and thus current dominantly flows between the base and collector of the transistor Q70. At this time, the current Isub_c flows in a direction opposite to the direction illustrated in FIG. 1. The adjustment circuit 70 increases the current Isub_c flowing from the bias current source 60 to the input terminal 80A through the second current path L2 as the variable power supply voltage Vcc2 decreases (see FIG. 5). The adjustment circuit 70 decreases the bias current Ief_pwr flowing from the bias current source 60 to the base of the transistor Q2 through the first current path L1 as the current Isub_c flowing from the bias current source 60 to the input terminal 80A through the second current path L2 increases (see FIG. 3). A decrease in the bias current Ief_pwr causes a decrease in the current Icc2 flowing through the collector of transistor Q2 (see FIG. 4). Thus, the gain of the transistor Q2 when the variable power supply voltage Vcc2 is in a range greater than or equal to the first voltage and less than or equal to the third voltage can be reduced. By selecting an appropriate value as the resistance value of the resistor element R73, it is possible to adjust the bias current Ief_pwr not to be excessively low. For example, the gain of the transistor Q2 when the variable power supply voltage Vcc2 is equal to the first voltage, which is lowest, can be reduced, compared with that when the highest efficiency is obtained at the maximum output power of the transistor Q2. Thus, the gain dispersion of the power amplifier circuit 10 can be improved.

Figure 8:
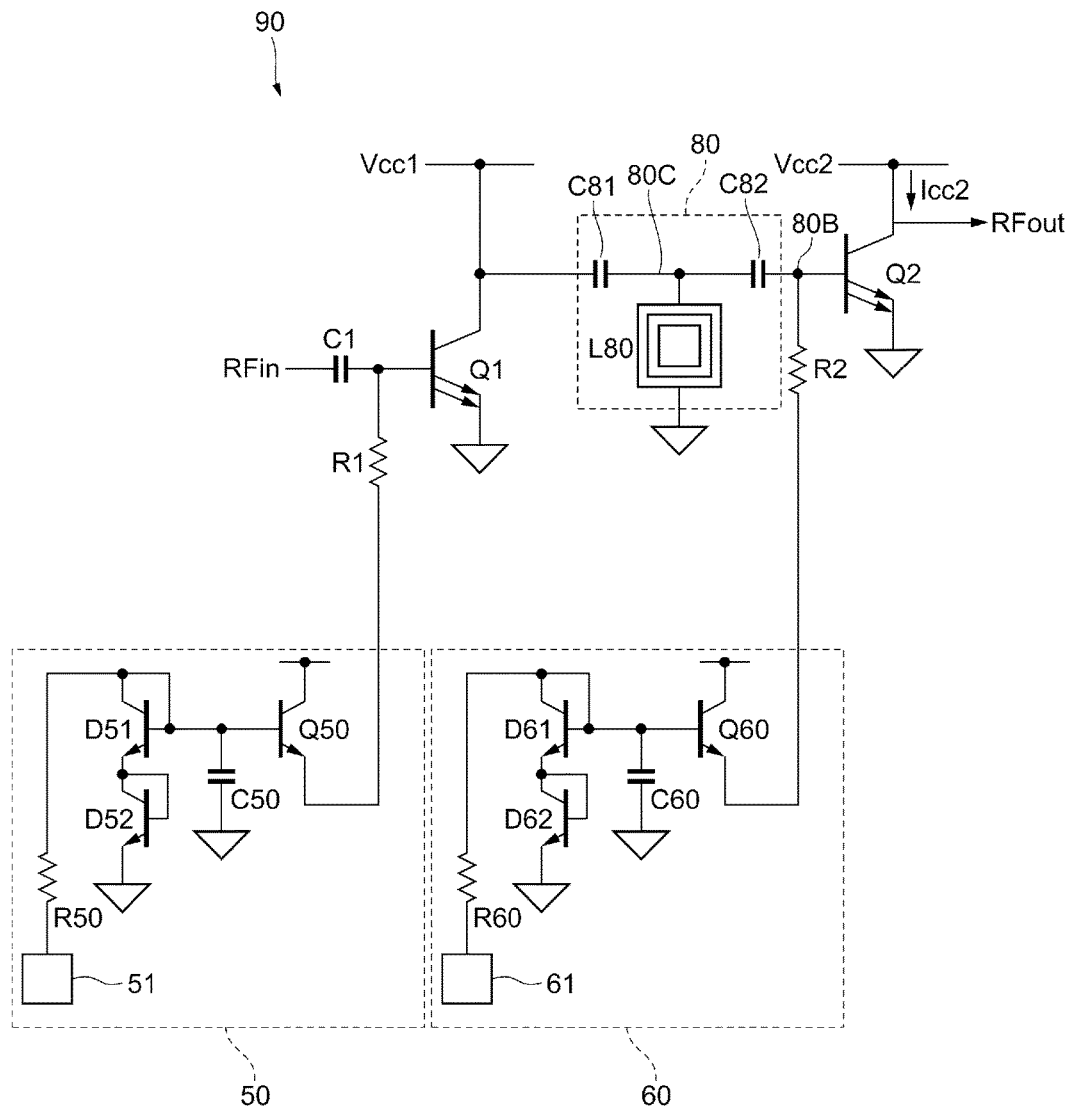
FIG. 8 is a circuit diagram of a power amplifier circuit according to a comparative example.

FIG. 8 is a circuit diagram of a power amplifier circuit 90 according to a comparative example. Unlike the power amplifier circuit 10 according to the first embodiment, the power amplifier circuit 90 according to the comparative example does not include the adjustment circuit 70. In FIG. 3, a graph 302 depicts the bias current Ief_pwr in the power amplifier circuit 90 according to the comparative example. Also, in FIG. 4, a graph 402 depicts the current Icc2 in the power amplifier circuit 90 according to the comparative example. The simulation results illustrated in FIG. 3 indicate that, due to the presence of the adjustment circuit 70, the bias current Ief_pwr in the power amplifier circuit 10 decreases when the variable power supply voltage Vcc2 is around the first voltage. Further, when the variable power supply voltage Vcc2 is around the second voltage, the bias current Ief_pwr in the power amplifier circuit 10 has a value similar to that of the bias current Ief_pwr in the power amplifier circuit 90. It is therefore indicated that the bias current Ief_pwr can be reduced to the extent necessary to improve the gain-dispersion characteristics.

Figure 9:
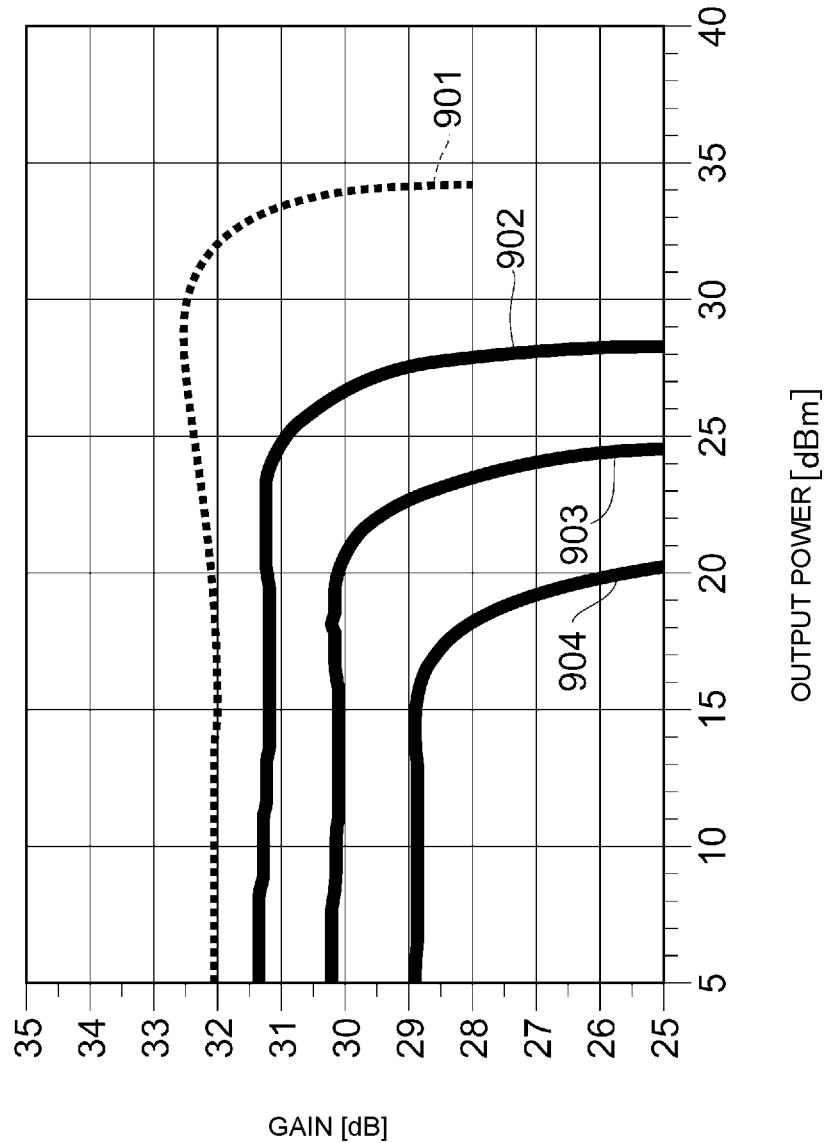
FIG. 9 is a graph depicting relationships between the output power and gain of the power amplifier circuit according to the first embodiment of the present disclosure.
Figure 10:
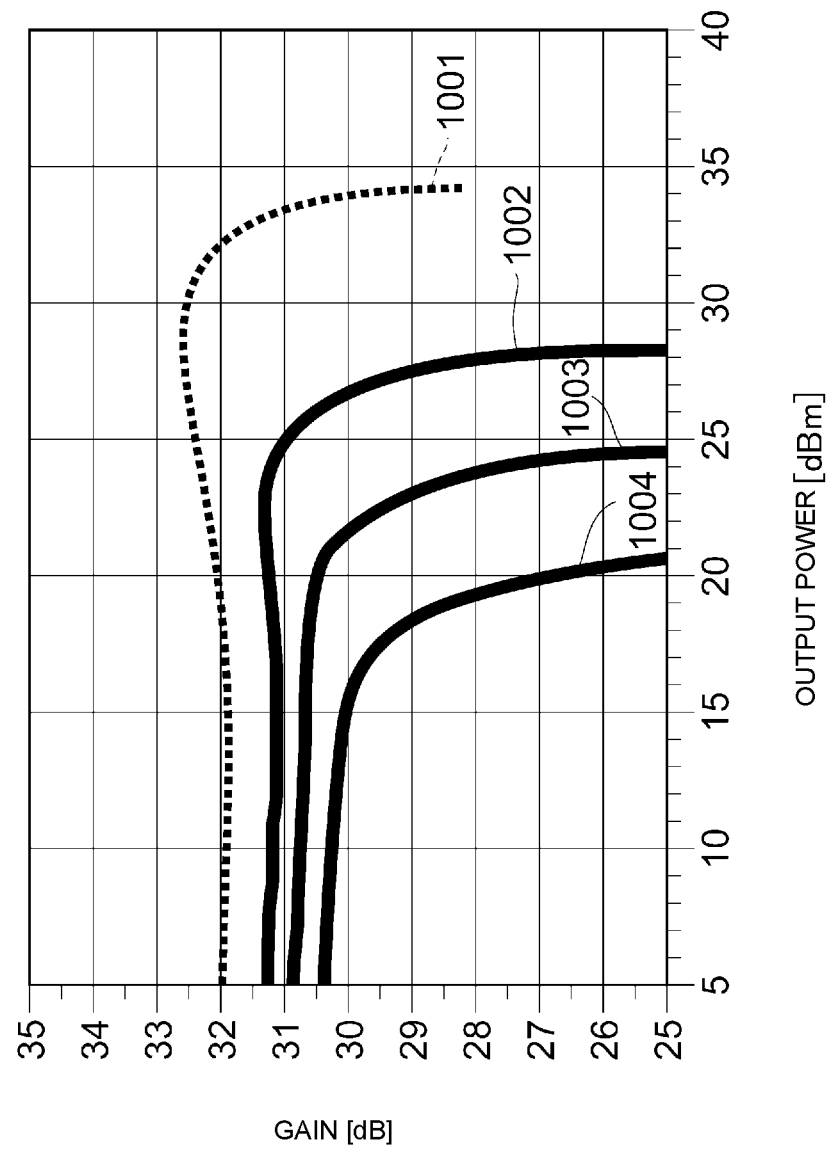
FIG. 10 is a graph depicting relationships between the output power and gain of the power amplifier circuit according to the comparative example.

In FIG. 9, numerals 901, 902, 903, and 904 represent relationships between the gain and output power of the power amplifier circuit 10 according to the first embodiment when the variable power supply voltage Vcc2 is set to 3.8 V, 2 V, 1.4 V, and 1 V, respectively. In FIG. 9, the horizontal axis represents the output power and the vertical axis represents the gain. In FIG. 10, in contrast, numerals 1001, 1002, 1003, and 1004 represent relationships between the gain and output power of the power amplifier circuit 90 according to the comparative example when the variable power supply voltage Vcc2 is set to 3.8 V, 2 V, 1.4 V, and 1 V, respectively. In FIG. 10, the horizontal axis represents the output power and the vertical axis represents the gain. The simulation results illustrated in FIG. 9 indicate that in the configuration of the power amplifier circuit 10 according to the first embodiment, the gain with respect to an output power of 5 dBm differs in accordance with the value of the variable power supply voltage Vcc2. In the configuration of the comparative example illustrated in FIG. 10, in contrast, the differences in gain with respect to an output power of 5 dBm in accordance with the value of the variable power supply voltage Vcc2 are small, compared with that illustrated in FIG. 9. Accordingly, the configuration according to the first embodiment provides large changes in gain in accordance with changes in the variable power supply voltage Vcc2. Therefore, the gain-dispersion characteristics can be improved.

As described above, in the power amplifier circuit 10 according to the first embodiment, the transistor Q70 operates as two P-N junction diodes when the variable power supply voltage Vcc2 is in a range greater than or equal to the first voltage and less than or equal to the third voltage. This enables a reduction in the bias current Ief_pwr flowing in the base of the transistor Q2. Thus, the gain-dispersion characteristics of the power amplifier circuit 10 can be improved. In particular, in a heterojunction bipolar transistor used as the transistor Q70, the turn-on voltage across the base-collector P-N junction is different from the turn-on voltage across the base-emitter P-N junction. By utilizing such a characteristic, it is possible to cause the current Isub_c to flow from the bias current source 60 to the input terminal 80A through the second current path L2 when the transistor Q70 operates as two P-N junction diodes. As the current Isub_c flowing from the bias current source 60 to the input terminal 80A through the second current path L2 increases, the bias current Ief_pwr flowing from the bias current source 60 to the base of the transistor Q2 through the first current path L1 can be decreased. In addition, since the bias current source 60 includes the emitter follower transistor Q60, the bias current Ief_pwr can be supplied stably.

In the foregoing description, a heterojunction bipolar transistor is exemplified as the transistor Q70. Alternatively, a field-effect transistor used as the transistor Q70 can also achieve similar operations and advantages. In the foregoing description, furthermore, the bias current supplied from the bias current source 60 to the transistor Q2 is adjusted by the adjustment circuit 70, by way of example. However, a bias current supplied from the bias current source 50 to the transistor Q1 may be adjusted by the adjustment circuit 70.

Figure 11:
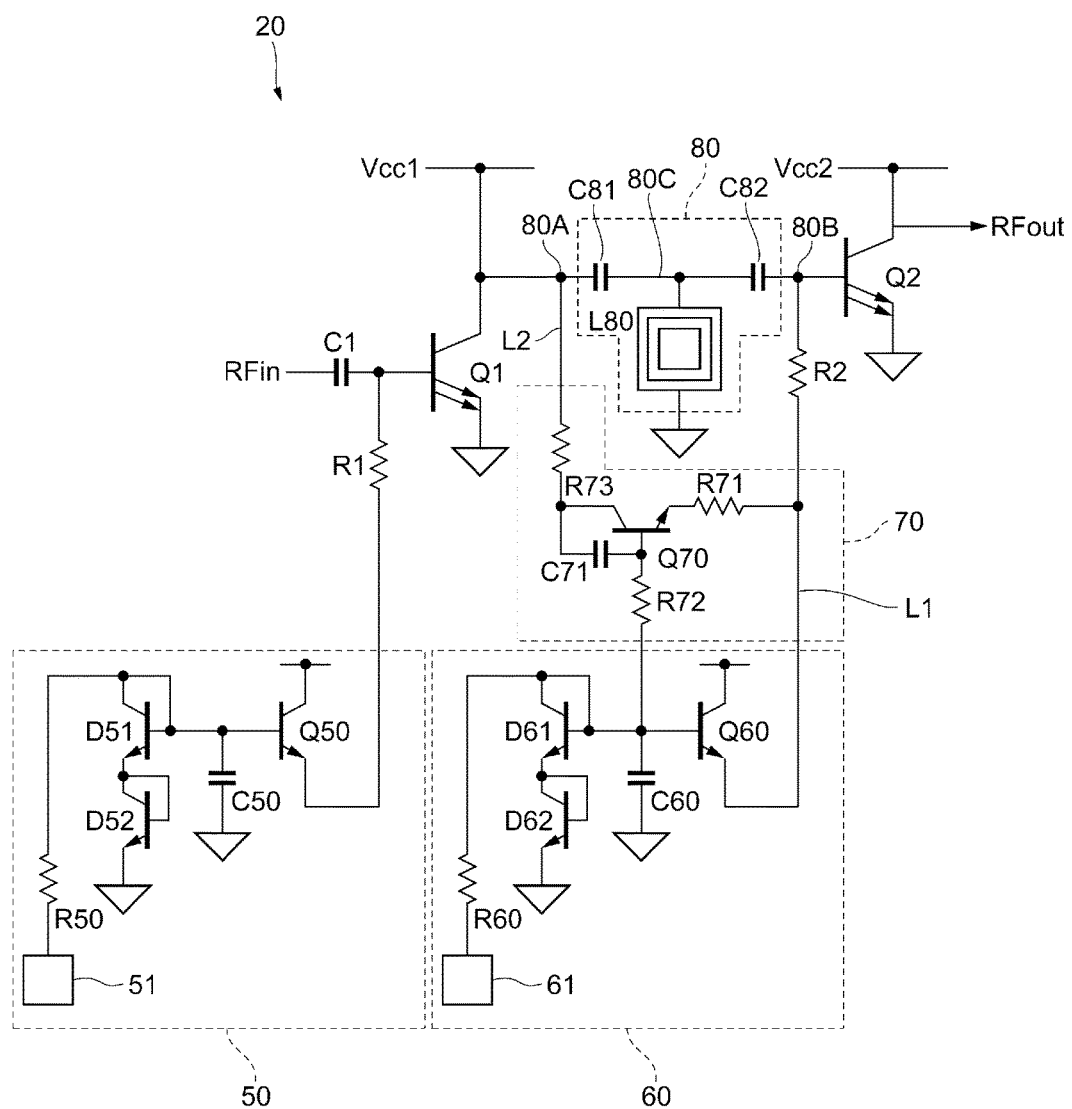
FIG. 11 is a circuit diagram of a power amplifier circuit according to a second embodiment of the present disclosure.

FIG. 11 is a circuit diagram of a power amplifier circuit 20 according to a second embodiment of the present disclosure. Unlike the adjustment circuit 70 of the power amplifier circuit 10 according to the first embodiment, an adjustment circuit 70 of the power amplifier circuit 20 according to the second embodiment further includes a capacitor element C71 connected between the base and collector of the transistor Q70.

Figure 12:
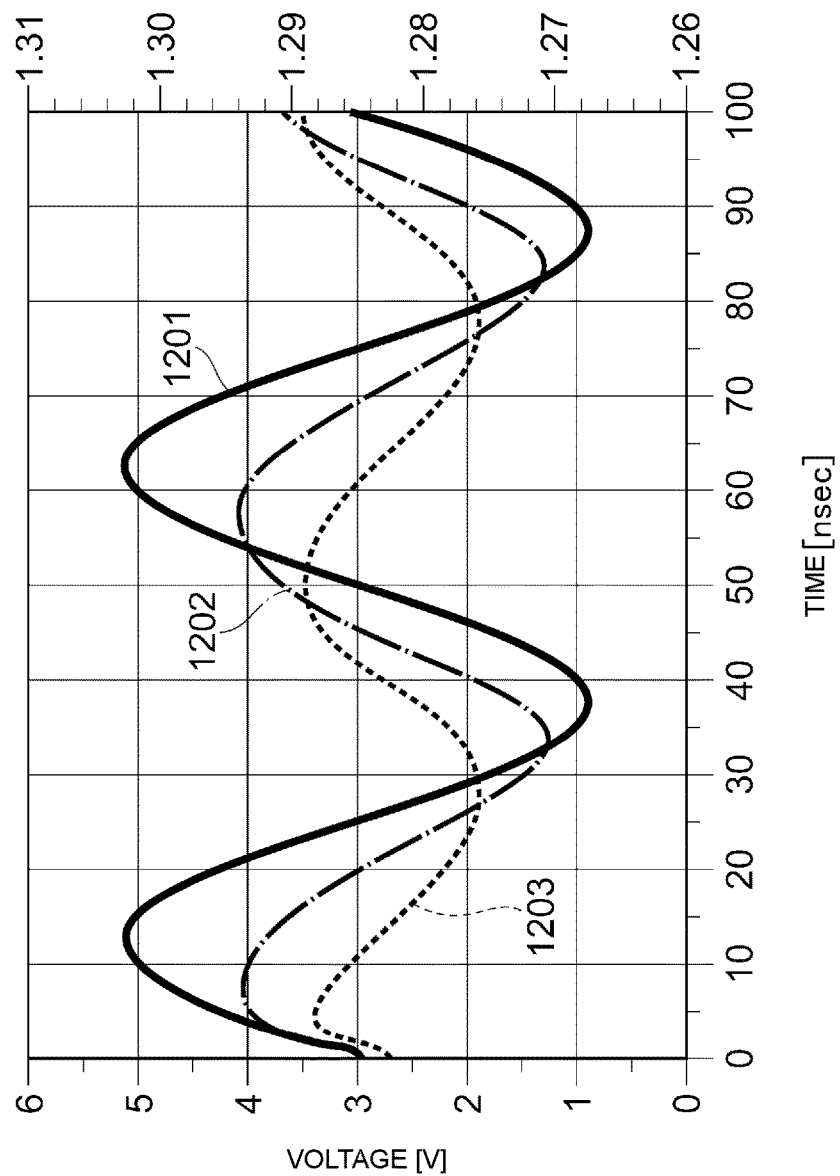
FIG. 12 is a graph depicting a relationship between a potential at the base of a transistor for amplifying an RF signal and a variable power supply voltage supplied to a transistor that is cascade-connected in a stage preceding the transistor, in accordance with the second embodiment of the present disclosure.

In FIG. 12, a graph 1201 depicts a change in the variable power supply voltage Vcc1, over time, which is supplied to the collector of the transistor Q1 in the power amplifier circuit 20 according to the second embodiment. In FIG. 12, a graph 1202 depicts a change in the potential at the base of the transistor Q2 in the power amplifier circuit 20 according to the second embodiment over time. In FIG. 12, a graph 1203 depicts a change in the potential at the base of the transistor Q2 in the power amplifier circuit 90 according to the comparative example over time. The simulation results illustrated in FIG. 12 indicate that, when the variable power supply voltage Vcc1 is a modulated signal, the capacitor element C71, which is connected between the base and collector of the transistor Q70, can suppress the delay in the phase of the potential at the base of the transistor Q2.

Figure 13:
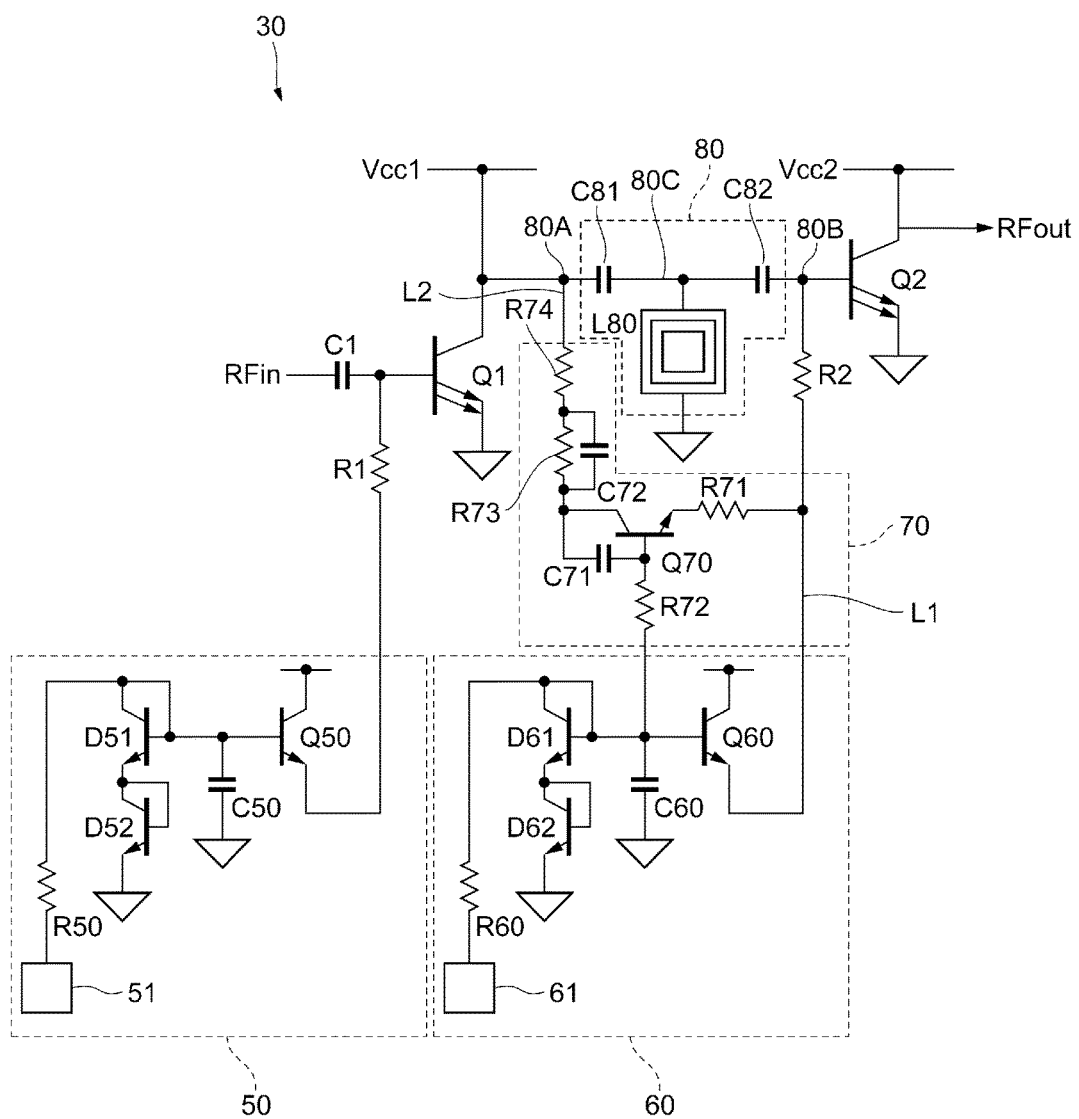
FIG. 13 is a circuit diagram of a power amplifier circuit according to a third embodiment of the present disclosure.

FIG. 13 is a circuit diagram of a power amplifier circuit 30 according to a third embodiment of the present disclosure. Unlike the adjustment circuit 70 of the power amplifier circuit 20 according to the second embodiment, an adjustment circuit 70 of the power amplifier circuit 30 according to the third embodiment further includes a capacitor element C72 connected in parallel to the resistor element R73. Furthermore, unlike the adjustment circuit 70 of the power amplifier circuit 20 according to the second embodiment, the adjustment circuit 70 of the power amplifier circuit 30 according to the third embodiment further includes a resistor element R74 connected between the resistor element R73 and the input terminal 80A. With this circuit configuration, the RF signal output from the transistor Q1 is routed to the third current path, thereby improving the amplitude-to-phase characteristics (amplitude modulation to phase modulation (AM-PM) characteristics) of the power amplifier circuit 30.

Figure 14:
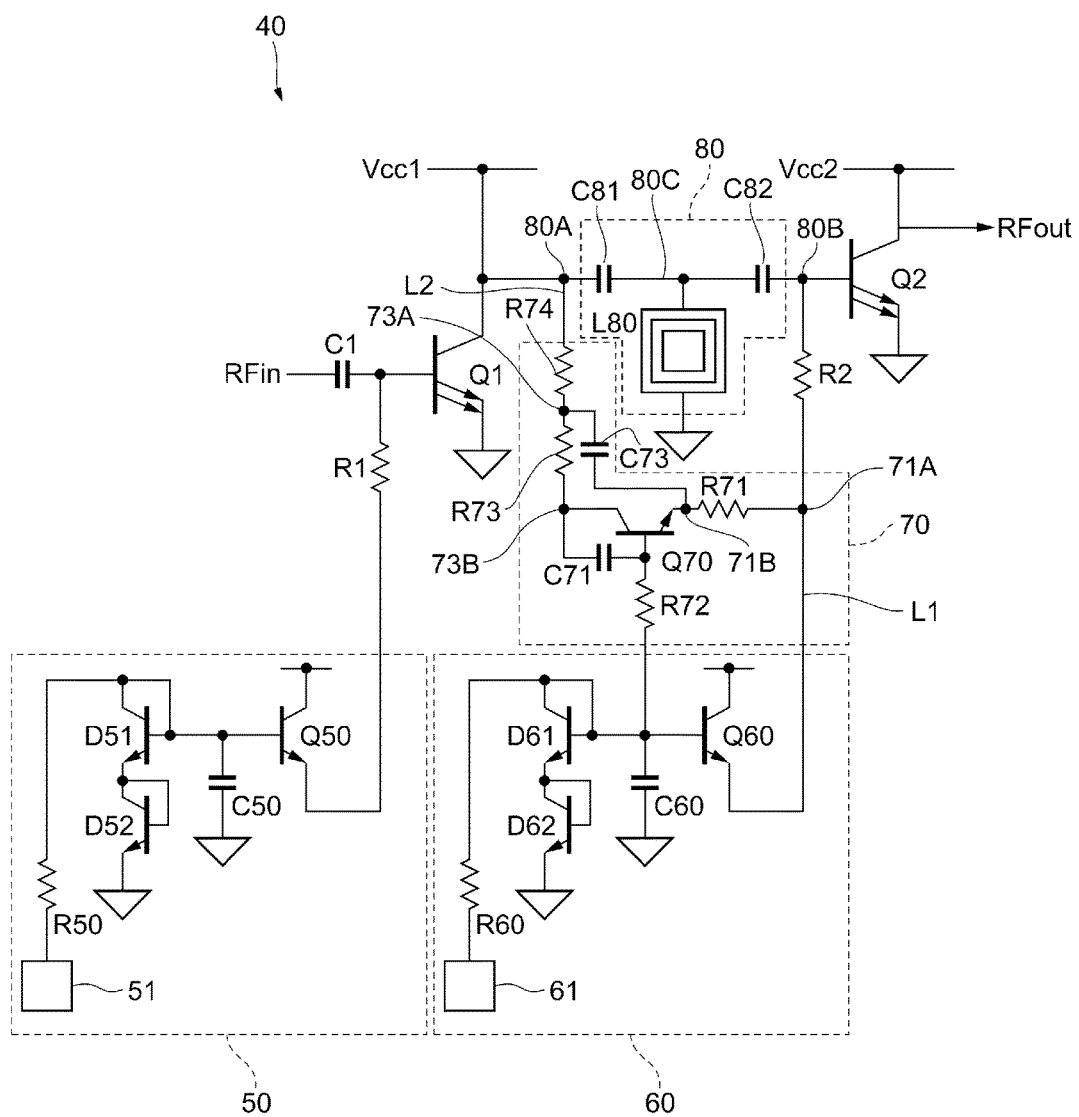
FIG. 14 is a circuit diagram of a power amplifier circuit according to a fourth embodiment of the present disclosure.

FIG. 14 is a circuit diagram of a power amplifier circuit 40 according to a fourth embodiment of the present disclosure. Unlike the adjustment circuit 70 of the power amplifier circuit 30 according to the third embodiment, an adjustment circuit 70 of the power amplifier circuit 40 according to the fourth embodiment includes a capacitor element C73 instead of the capacitor element C72. The resistor element R73 has an end 73A connected to the input terminal 80A via the resistor element R74. The resistor element R73 has another end 73B connected to the collector of the transistor Q70. The resistor element R71 has an end 71A connected to the first current path L1. The resistor element R71 has another end 71B connected to the emitter of the transistor Q70. The capacitor element C73 is connected between the end 73A of the resistor element R73 and the end 71B of the resistor element R71. With this circuit configuration, the RF signal output from the transistor Q1 is routed to the third current path, thereby improving the amplitude-to-phase characteristics (AM-PM characteristics) of the power amplifier circuit 40.

In this specification, when the resistor elements R71, R72, and R73 are individually distinguished, the resistor element R71 may be referred to as a "first resistor element", the resistor element R72 as a "second resistor element", and the resistor element R73 as a "third resistor element". Further, when the diodes D61 and D62 are distinguished from each other, the diode D61 may be referred to as a "first diode" and the diode D62 as a "second diode". Further, when the capacitor elements C71, C72, and C73 are distinguished from each other, the capacitor element C71 may be referred to as a "first capacitor element", the capacitor element C72 as a "second capacitor element", and the capacitor element C73 as a "third capacitor element".

The embodiments described above are intended to help easily understand the present disclosure and are not to be used to construe the present disclosure in a limiting fashion. The present disclosure may be modified or improved without departing from the gist thereof, and equivalents of such modifications or improvements are also included in the present disclosure. That is, the embodiments may be appropriately modified in design by those skilled in the art, and such modifications also fall within the scope of the present disclosure so long as the modifications include the features of the present disclosure. Elements included in the embodiments and the arrangements and so on thereof are not limited to those illustrated exemplarily but can be modified as appropriate.

While embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplifier circuit comprising:
a matching circuit having an input terminal and an output terminal;
a transistor having a base connected to the output terminal, and a collector supplied with a variable power supply voltage greater than or equal to a first voltage and less than or equal to a second voltage, the transistor being configured to amplify a radio frequency signal input to the base of the transistor via the matching circuit;
a bias current source configured to supply a bias current to the base of the transistor through a first current path; and
an adjustment circuit configured to adjust the bias current supplied to the base of the transistor in accordance with the variable power supply voltage,
wherein when the variable power supply voltage is greater than or equal to the first voltage and less than or equal to a third voltage, the third voltage being greater than the first voltage and less than the second voltage, the adjustment circuit is configured to:
increase a current flowing from the bias current source to the input terminal through a second current path as the variable power supply voltage decreases, and
decrease the bias current flowing from the bias current source to the base of the transistor through the first current path as the current flowing from the bias current source to the input terminal through the second current path increases.

2. The power amplifier circuit according to claim 1, wherein:
the adjustment circuit includes a heterojunction bipolar transistor, a first resistor element, a second resistor element, and a third resistor element,
the heterojunction bipolar transistor has an emitter connected to the first current path via the first resistor element,
the heterojunction bipolar transistor has a base connected to the bias current source via the second resistor element,
the heterojunction bipolar transistor has a collector connected to the input terminal via the third resistor element, and
the second current path is a path through which current flows from the bias current source to the input terminal via the second resistor element, the base and collector of the heterojunction bipolar transistor, and the third resistor element.

3. The power amplifier circuit according to claim 2, wherein:
the bias current source includes a first diode, a second diode, and an emitter follower transistor,
the first diode has an anode connected to a power supply terminal,
the first diode has a cathode connected to an anode of the second diode,
the second diode has a cathode connected to ground,
the emitter follower transistor has a base connected to the anode of the first diode and also connected to the second resistor element via the second current path, and
the emitter follower transistor has an emitter connected to the base of the transistor via the first current path.

4. The power amplifier circuit according to claim 2, further comprising:
a first capacitor element connected between the base and collector of the heterojunction bipolar transistor.

5. The power amplifier circuit according to claim 3, further comprising:
a first capacitor element connected between the base and collector of the heterojunction bipolar transistor.

6. The power amplifier circuit according to claim 2, further comprising:
a second capacitor element connected in parallel with the third resistor element.

7. The power amplifier circuit according to claim 3, further comprising:
a second capacitor element connected in parallel with the third resistor element.

8. The power amplifier circuit according to claim 4, further comprising:
a second capacitor element connected in parallel with the third resistor element.

9. The power amplifier circuit according to claim 5, further comprising:
a second capacitor element connected in parallel with the third resistor element.

10. The power amplifier circuit according to claim 2, wherein:
the third resistor element has a first end connected to the input terminal,
the third resistor element has a second end connected to the collector of the heterojunction bipolar transistor,
the first resistor element has a first end connected to the first current path,
the first resistor element has a second end connected to the emitter of the heterojunction bipolar transistor, and
the power amplifier circuit further comprises a third capacitor element connected between the first end of the third resistor element and the second end of the first resistor element.

11. The power amplifier circuit according to claim 3, wherein:
the third resistor element has a first end connected to the input terminal,
the third resistor element has a second end connected to the collector of the heterojunction bipolar transistor,
the first resistor element has a first end connected to the first current path,
the first resistor element has a second end connected to the emitter of the heterojunction bipolar transistor, and
the power amplifier circuit further comprises a third capacitor element connected between the first end of the third resistor element and the second end of the first resistor element.

12. The power amplifier circuit according to claim 4, wherein:
the third resistor element has a first end connected to the input terminal,
the third resistor element has a second end connected to the collector of the heterojunction bipolar transistor,
the first resistor element has a first end connected to the first current path,
the first resistor element has a second end connected to the emitter of the heterojunction bipolar transistor, and the power amplifier circuit further comprises a third capacitor element connected between the first end of the third resistor element and the second end of the first resistor element.

13. The power amplifier circuit according to claim 5, wherein:
the third resistor element has a first end connected to the input terminal,
the third resistor element has a second end connected to the collector of the heterojunction bipolar transistor,
the first resistor element has a first end connected to the first current path,
the first resistor element has a second end connected to the emitter of the heterojunction bipolar transistor, and
the power amplifier circuit further comprises a third capacitor element connected between the first end of the third resistor element and the second end of the first resistor element.

14. The power amplifier circuit according to claim 1, wherein:
the variable power supply voltage is supplied by an envelope tracking power supply.

\* \* \* \* \*